United States Patent [19]

Isaacson et al.

[11] Patent Number: 5,708,419
[45] Date of Patent: Jan. 13, 1998

[54] METHOD OF WIRE BONDING AN INTEGRATED CIRCUIT TO AN ULTRAFLEXIBLE SUBSTRATE

[75] Inventors: Mark R. Isaacson, San Jose, Calif.; Anthony F. Piccoli, Audubon; Michael Holloway, Cherry Hill, both of N.J.

[73] Assignee: Checkpoint Systems, Inc., Thorofare, N.J.

[21] Appl. No.: 681,195

[22] Filed: Jul. 22, 1996

[51] Int. Cl.⁶ .......................... G08B 13/187; H05K 3/30
[52] U.S. Cl. ...................... 340/572; 29/829; 29/832; 29/841; 29/850; 340/825.34; 340/825.54
[58] Field of Search ................. 340/572, 825.34, 340/825.54; 29/841, 832, 850, 829

[56] References Cited

U.S. PATENT DOCUMENTS

| | | | |
|---|---|---|---|
| 4,381,602 | 5/1983 | McIver | 29/832 |
| 4,656,463 | 4/1987 | Anders et al. | 340/572 |
| 5,103,210 | 4/1992 | Rode et al. | 340/572 |
| 5,276,431 | 1/1994 | Piccoli et al. | 340/572 |
| 5,361,491 | 11/1994 | Oomachi et al. | 29/832 |
| 5,430,441 | 7/1995 | Bickley et al. | 340/825.54 |
| 5,444,223 | 8/1995 | Blama | 235/435 |
| 5,528,222 | 6/1996 | Moskowitz et al. | 340/572 |
| 5,546,654 | 8/1996 | Wojnarowski et al. | 29/841 |

OTHER PUBLICATIONS

John Bowers, "Road to Intelligent Taging is Paved With Opportunities", *Automatic I.D. News*, (Oct., 1995), pp. 86–87.

*Primary Examiner*—Glen Swann
*Attorney, Agent, or Firm*—Panitch Schwarze Jacobs & Nadel, P.C.

[57] ABSTRACT

A method of electrically connecting an integrated circuit (IC) to at least one electrical conductor on a flexible substrate. A flexible dielectric substrate has an IC attachment area and at least one resonant circuit formed thereon. The resonant circuit is formed with a first conductive pattern disposed on a first principal surface of the flexible substrate and a second conductive pattern disposed on a second, opposite principle surface of the flexible substrate. The first conductive pattern is electrically connected to the second conductive pattern such that the first and second conductive patterns form an inductor and a capacitor, with the inductor also functioning as an antenna. The IC attachment area of the flexible substrate is cleaned and the flexible substrate is secured in a fixed position in a plenum to prevent substantial movement thereof. The IC is secured to the IC attachment area of the flexible substrate to minimize movement of the IC relative to the flexible substrate. Wire bonding of the IC to at least one electrical conductor of the resonant circuit is performed to electrically connect the IC to the at least one electrical conductor. A protective covering is applied over the IC and the wire bond to protect the wire bond from being damaged by external forces.

21 Claims, 5 Drawing Sheets

METHOD OF WIRE BONDING AN INTEGRATED CIRCUIT TO AN ULTRAFLEXIBLE SUBSTRATE

FIELD OF THE INVENTION

The present invention relates to electrically connecting an integrated circuit to an ultraflexible substrate and, more particularly, to an integrated circuit mounted on a radio frequency identification tag.

BACKGROUND OF THE INVENTION

Printed circuit boards (PCBs) and integrated circuits (ICs) are well known and commonly used in many different applications. Integrated circuits provide large amounts of electronic functionality in a small area. Typically, a PCB comprises a plurality of layers, alternating between electrically conductive layers and insulative layers, and includes a plurality of through holes or vias for interconnecting the conductive layers. One or more ICs are mounted to the PCB by placing pins extending from the IC into predetermined holes in the PCB and then soldering the pins to one or more of the conductive layers of the PCB. The insulative layers of the PCB are generally composed of epoxy and glass, and the conductive layers are generally of copper. Accordingly, PCBs comprise very rigid structures capable of withstanding high temperatures and it is a relatively simple task to mechanically secure and electrically connect an IC to the PCB. However, there are situations where it would be advantageous to attach an IC to a flexible or non-rigid substrate which generally cannot be subjected to high temperatures, such as the temperature required for performing soldering processes. Moreover, it would also be desirable to attach an IC to an ultraflexible substrate. An ultraflexible substrate comprises a substrate which is even more flexible (and less rigid) than present "flexible" substrates, such as kapton. Accordingly, as referred to herein, the term "flexible" is meant to refer to substrates which are more flexible than presently commercially available kapton substrates. Attempts to wire-bond ICs to such flexible substrates have had limited success due to difficulties in transferring ultrasonic energy to only the wirebonding area. That is, due to the flexible nature of the substrate, much of the ultrasonic energy required for the wirebonding process is lost through movement of the substrate caused by the ultrasonic energy.

The present invention provides a flexible substrate having an integrated circuit mechanically attached and electrically connected thereto. The present invention also provides a method of electrically connecting an IC to such a flexible substrate.

SUMMARY OF THE INVENTION

Briefly stated, the present invention comprises a method of electrically connecting an integrated circuit (IC) to at least one electrical conductor on a flexible substrate. The method comprises the steps of:

(a) providing a flexible dielectric substrate having an IC attachment area located on one of a first principal surface and a second, opposite principal surface of the substrate and at least one resonant circuit comprising a first conductive pattern disposed on the first principal surface and a second conductive pattern disposed on the second principal surface, wherein the first conductive pattern is electrically connected to the second conductive pattern such that the first and second conductive patterns form an inductor and a capacitor, wherein the inductor functions as an antenna;

(b) cleaning an IC bond attach area of the substrate, the IC bond attach area comprising an area of the substrate and the resonant circuit proximate to and including the IC attachment area;

(c) securing the flexible substrate in a fixed position to prevent substantial movement of the substrate;

(d) securing the IC to the IC attachment area of the flexible substrate to minimize movement of the IC relative to the flexible substrate;

(e) wire bonding the IC to the resonant circuit, thereby electrically connecting the IC to the resonant circuit with at least one wire bond; and (f) applying a protective covering over the at least one wire bond to protect the at least one wire bond from being damaged by external forces.

The present invention also provides a radio frequency identification (RFID) tag for use with a communication system having means for detecting the presence of an RFID tag within a surveilled area utilizing electromagnetic energy at a frequency within a predetermined frequency range and means for receiving digitally encoded information transmitted from the RFID tag. The RFID tag comprises a flexible dielectric substrate, at least one resonant circuit comprising a first conductive pattern disposed on a first principal surface of the flexible substrate, a second conductive pattern disposed on a second, opposite principle surface of the flexible substrate, wherein the first conductive pattern is electrically connected to the second conductive pattern such that the first and second conductive patterns form an inductor and a capacitor, wherein the inductor functions as an antenna, an IC attachment area on the substrate, an integrated circuit (IC) attached to the IC attachment area and electrically connected to the resonant circuit, the IC storing digitally encoded information, wherein detection by the antenna of a signal at a predetermined frequency causes the antenna to provide power to the IC such that the digitally encoded information is output therefrom and transmitted by the antenna at a predetermined frequency range, and an encapsulant layer covering the IC and the electrical connections between the IC and the resonant circuit.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred, it being understood, however, that the invention is not limited to the precise arrangements and instrumentalities disclosed. In the drawings.

DETAILED DESCRIPTION OF PREFERRED EMBODIMENTS

Figure 1:
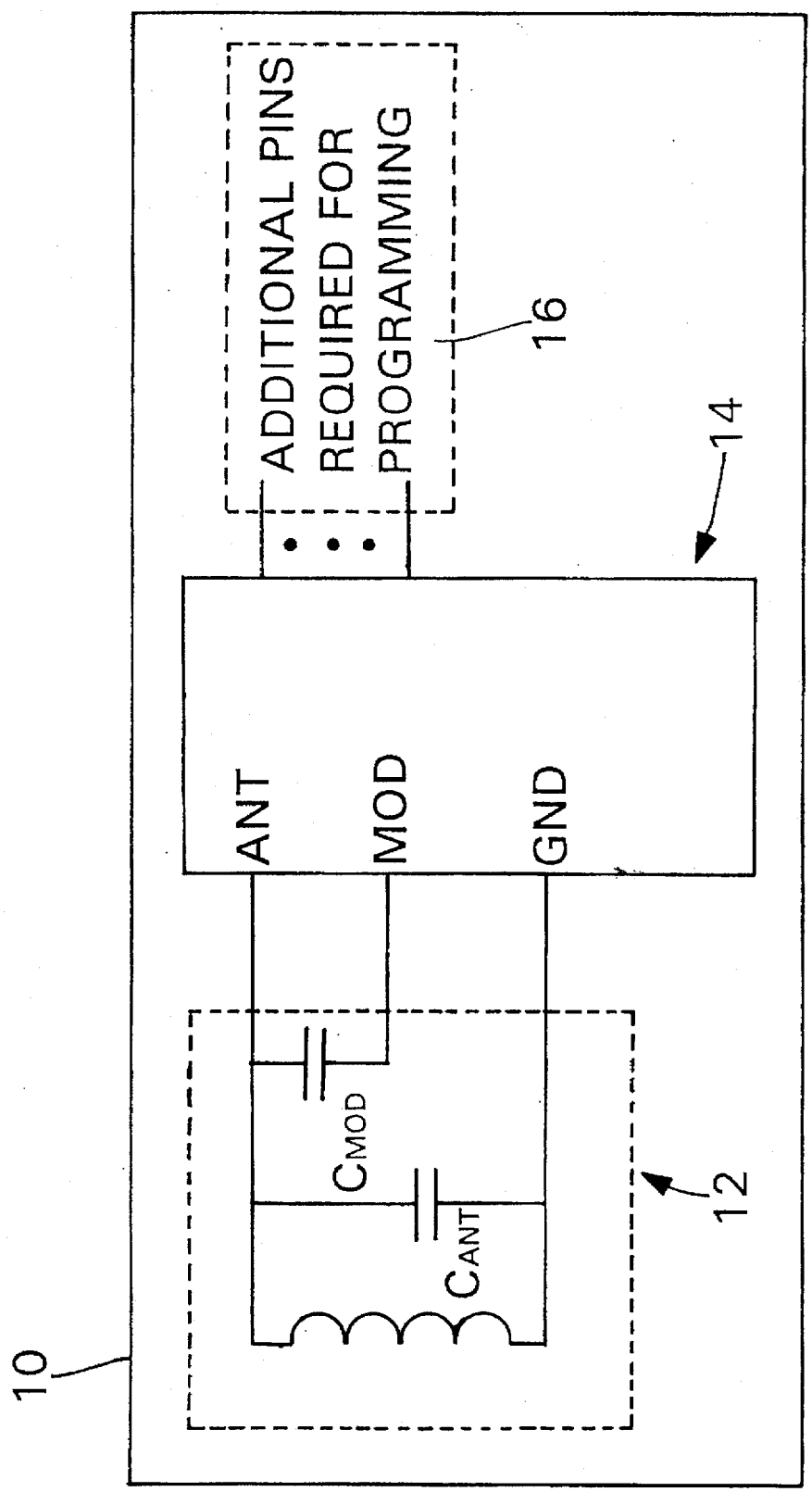
FIG. 1 is a schematic diagram of an equivalent electrical circuit of a resonant frequency identification (RFID) tag in accordance with a preferred embodiment of the present invention.

Certain terminology is used in the following description for convenience only and is not limiting. The words "top", "bottom", "lower" and "upper" designate directions in the drawings to which reference is made. The term "flexible" is meant to refer to "ultraflexible" substrates, which are substrates that are more flexible than substrates constructed from kapton, as are known by those of ordinary skill in the art. The terminology includes the words above specifically mentioned, derivatives thereof and words of similar import.

The present invention is directed to the fabrication of a thin, flexible resonant circuit with a custom integrated circuit (IC) and provides a method of wire-bonding the IC to the flexible substrate of the resonant circuit. Although the invention is described with reference to resonant circuit tags, and in particular, radio frequency identification (RFID) tags which are powered by a radio frequency interrogation signal, it will be recognized by those of ordinary skill in the art that the inventive concepts disclosed are applicable to other devices which would benefit from having an integrated circuit attached and connected to a flexible substrate. Accordingly, the present invention is not meant to be limited to RFID tags.

RFID tags are generally known and applicable to a wide variety of uses. U.S. Pat. No. 5,430,441 discloses a transponding tag which transmits a digitally encoded signal in response to an interrogation signal. The tag comprises a rigid substrate constructed from a plurality of dielectric layers and conductive layers and includes an integrated circuit embedded entirely within a hole in the substrate and tab bonded to conductive foil traces. Another RFID tag is disclosed in U.S. Pat. No. 5,444,223 to Blama. Blama recognized the advantage of constructing a tag from low cost, flexible materials, such as paper. However, rather than store a predetermined identification code in a single integrated circuit, Blama constructed a tag using a plurality of circuits, each circuit representing a single bit of information.

According to the present invention, thin, flexible RFID tags are made utilizing a very thin substrate of a dielectric material, such as polyethylene, laminated on both sides with a very thin layer of conductive material, such as aluminum foil, which is thereafter photo-printed and etched to form a two-sided circuit consisting of at least one inductor connected with one or more capacitors thereby forming a resonant circuit. One of the layers of conductive material also includes an attachment area for receiving an IC. The IC is attached to the attachment area and is wire bonded to the resonant circuit, thereby electrically connecting the IC to the resonant circuit.

Referring now to the drawings, wherein the same reference numeral designations are applied to corresponding elements throughout the several figures, there is shown in FIG. 1 a schematic diagram of an equivalent electrical circuit of a resonant frequency identification tag 10 in accordance with a preferred embodiment of the present invention. The tag 10 comprises a resonant circuit 12 electrically connected to an integrated circuit (IC) The resonant circuit 12 may comprise one or more inductive elements electrically connected to one or more capacitive elements. In a preferred embodiment, the resonant circuit 12 is formed by the combination of a single inductive element, inductor, or coil L electrically connected with a capacitive element or capacitance $C_{ANT}$ in a series loop. As is well known to those of ordinary skill in the art, the frequency of the resonant circuit 12 depends upon the values of the inductor coil L and the capacitor $C_{ANT}$. Such a resonant circuit is shown and described in detail in U.S. Pat. No. 5,276,431, which is hereby incorporated by reference. The size of the inductor L and the value of the capacitor $C_{ANT}$ are determined based upon the desired resonant frequency of the resonant circuit 12 and the need to maintain a low induced voltage across the plates of the capacitor. In one embodiment of the invention, tags 10 are constructed which operate at 13.56 MHz. Although the tag 10 includes a single inductive element L and a single capacitor element $C_{ANT}$, multiple inductor and capacitor elements could alteratively be employed. For instance, multiple element resonant circuits are well known in the electronic security and surveillance art, such as described in U.S. Pat. No. 5,103,210 entitled "Activatable/Deactivatable Security Tag for Use with an Electronic Security System", which is incorporated herein by reference.

The IC 14 stores a predetermined digital value, which can be used for a variety of purposes, such as to identify a particular object or person associated with the tag 10. The stored digital value may be unique to each tag 10, or in some instances, it may be desirable for two or more tags to have the same stored digital value. In addition to identifying an object, the IC 14 could be used to store product warranty information. A proximity reader or interrogator device (not shown) is used to read the information stored in the IC 14. In operation, the proximity reader creates an electromagnetic field at the resonant frequency of the resonant circuit 12. When the tag 10 is placed proximate to the reader and in the electromagnetic field, a voltage is induced on the inductive coil L, which provides power to the IC 14 at the ANT input of the IC 14. The IC 14 internally rectifies the induced AC voltage at the ANT input to provide an internal DC voltage source. When the internal DC voltage reaches a level that assures proper operation of the IC 14, the IC 14 functions to output the digital value stored therein at the MOD output of the IC 14. A modulation capacitor $C_{MOD}$ is connected to the MOD output of the IC 14 and to the resonant circuit 12. The IC output pulses switch the capacitor $C_{MOD}$ into and out of the resonant circuit 12 by making and breaking ground connections to change the overall capacitance of the resonant circuit 12 in accordance with the stored data, which changes the resonant frequency of the resonant circuit 12, detuning it from the principal operational frequency to a predetermined higher frequency. The reader detects the consumption of energy within its electromagnetic field. Data pulses of the tag 10 are created by the tuning and detuning of the resonant circuit 12. The reader senses the changes in the consumption of energy to determine the digital data value output from the IC 14.

The IC 14 also includes a power return or GND output and one or more additional inputs 16 which are used for programming the IC 14 (i.e. storing or altering the digital value therein). In the presently preferred embodiment, the IC 14 comprises 64 bits of nonvolatile memory and the reader and tag 10 operate at 13.56 MHz. Of course, it will be apparent to those of ordinary skill in the art that memory chips having a either a greater or smaller storage capacity may be used such that the IC 14 stores more or fewer memory bits. In addition, it will be apparent to those of ordinary skill in the art that the resonant circuit 12 and the reader may operate at radio frequencies other than 13.56 MHz.

Figure 2:
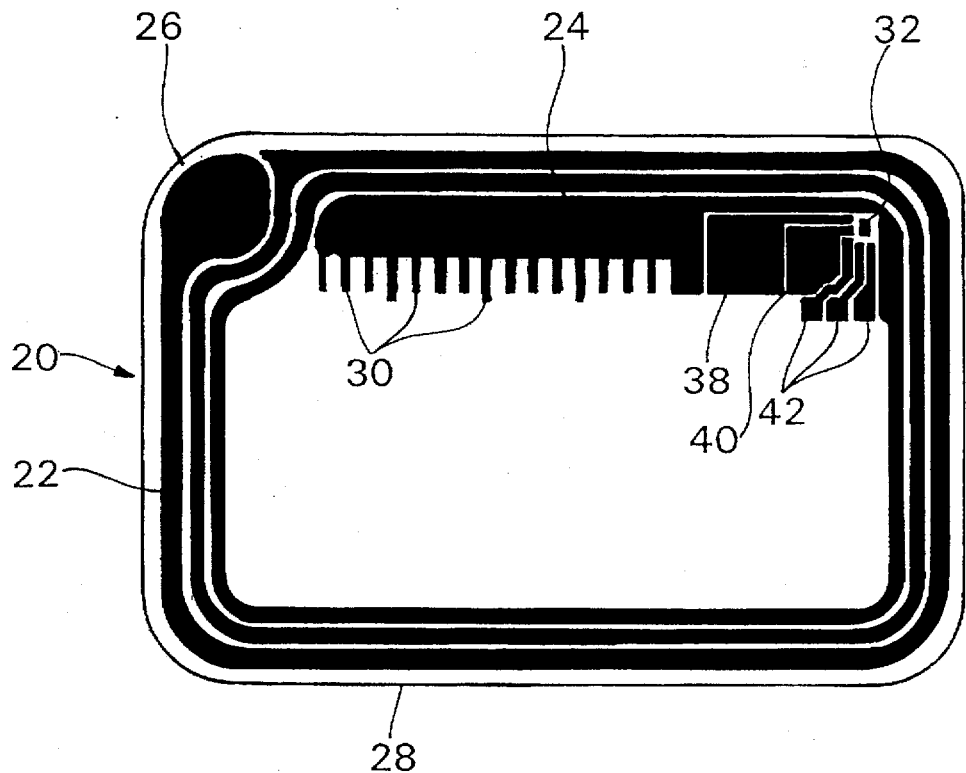
FIG. 2 is an enlarged plan view of one side of a flexible printed circuit RFID tag in accordance with a first embodiment of the present invention.

Referring now to FIG. 2, one side or principal surface of a first embodiment of an RFID tag 20 is shown. The tag 20, like the tag 10, includes a resonant circuit comprising an inductor in the form of a coil 22 and a capacitor 24. The capacitor 24 comprises two plates located on opposite sides or principal surfaces of a substrate 26. The inductor coil 22 is located on one of the principal surfaces of the substrate 26 and comprises a coil which extends proximate to and around a peripheral outer edge 28 of the substrate 26. Since only one side of the tag 20 is shown, only one plate of the capacitor 24 is shown in FIG. 2. The plate of capacitor 24 includes a plurality of fingers or extensions 30 which are provided for tuning the resonant circuit. That is, the fingers 30 may be cut, etched or otherwise trimmed and removed to change the value of the capacitor 24, and thus the resonant frequency of the resonant circuit 12.

In the first preferred embodiment, the substrate 26 comprises a generally rectangular, planar insulative or dielectric material which is preferably flexible, such as paper or a polymeric material. In the presently preferred embodiment, the substrate 26 comprises polyethylene. However, it will be apparent to those of skill in the art that the substrate 26 may be constructed of other materials, such as any solid material or composite structures of materials as long as the substrate 26 is insulative and can be used as a dielectric. The circuit elements and components of the resonant circuit 12 are formed on both principal surfaces of the substrate 26 by patterning conductive material on the surfaces of the substrate 26. A first conductive pattern is imposed on the first side or surface of the substrate 26, which surface is arbitrarily selected as the top surface of the tag 20, and a second conductive pattern is imposed on the opposite or second side or surface (not shown) of the substrate 26, sometimes referred to as the back or bottom surface. The conductive patterns may be formed on the substrate surfaces with electrically conductive materials of a known type and in a manner which is well known in the electronic article surveillance art. The conductive material is preferably patterned by a subtractive process (i.e. etching), whereby unwanted material is removed by chemical attack after desired material has been protected, typically with a printed on etch resistant ink. In the preferred embodiment, the conductive material comprises an aluminum foil. However, other conductive materials (e.g., conductive foils or inks, gold, nickel, copper, phosphor bronzes, brasses, solders, high density graphite or silver-filled conductive epoxies) can be substituted for aluminum without changing the nature of the resonant circuit or its operation.

The first and second conductive patterns establish at least one resonant circuit, such as the resonant circuit 12, having a resonant frequency within a predetermined operational frequency range, such as the aforementioned preferred frequency of 13.56 MHz. As previously discussed in regard to FIG. 1, the resonant circuit 12 is formed by the combination of a single inductive element, inductor, or coil L electrically connected with a single capacitive element or capacitance $C_{ANT}$ in a series loop. The inductive element L formed by the coil portion 22 of the first conductive pattern is formed as a spiral coil of conductive material on a first principal surface of the substrate 26 and the capacitive element $C_{ANT}$, as previously discussed, is comprised of a first plate formed by a generally rectangular plate (shown at 24) of the first conductive pattern and a second plate formed by a corresponding, aligned generally rectangular plate of the second conductive pattern (not shown). As will be appreciated by those of skill in the art, the first and second plates are generally in registry and are separated by the dielectric substrate 26. The first plate of the capacitor element $C_{ANT}$ is electrically connected to one end of the inductor coil 22. Similarly, the second plate of the capacitor element $C_{ANT}$ is electrically connected by a weld connection (not shown) extending through the substrate 26 to connect the second plate to the other end of the inductor coil 22, thereby connecting the inductive element L to the capacitor element $C_{ANT}$ in a well known manner.

In the presently preferred embodiment, the substrate 26 and the first and second conductive patterns is approximately 3.3 mils thick, with the substrate 26 being about 1.0 mil thick, the first conductive pattern (i.e. the coil layer or side shown in FIGS. 2 and 3) being about 2.0 mils thick and the second conductive pattern being about 0.3 mils thick. Since the substrate 26 is relatively thin and very flexible, it has been found that the substrate 26 does not, by itself, provide adequate support for receiving the IC 14 and maintaining the IC 14 in a firm or stable position such that electrical connections between the IC 14 and the resonant circuit 12 may be made which are strong and not readily broken or compromised. Accordingly, the present invention provides an IC receiving or attachment area 32 for receiving and supporting the IC 14. The IC attachment area 32 is located on a surface of the substrate 26 and is constructed of a material suitable to sufficiently support the IC 14. The IC attachment area 32 provides a stable surface to which the IC 14 may be attached or secured so that the IC 14 does not move relative to the substrate 26 and the resonant circuit 12 during an ultrasonic wirebonding operation. In the presently preferred embodiment, the IC attachment area 32 has the same general dimensions as the IC 14 (e.g. generally rectangular in shape) but is of somewhat greater dimensions than the IC 14 so that it is not overly difficult to place the IC 14 on the IC attachment area 32. Preferably, in order to keep the manufacturing process efficient and cost effective, the IC attachment area 14 is constructed of the same material as the first conductive pattern and is formed on the substrate 26 at the same time that the resonant circuit 12 is formed on the substrate 26. The IC attachment area 32 should be located as close as possible to those areas or pads to which the IC 14 is to be electrically connected so that the electrical connections are not excessive in length. As shown in FIG. 2, in a first preferred embodiment, the IC attachment area 32 is located at an upper right-hand side of the top surface of the substrate 26 proximate to, but not in contact with the coil 22 or the capacitor 24 such that the attachment area 32 is physically and electrically isolated from the other components. This location is suitable because it allows the IC 14 to be positioned or located proximate to each of the areas or pads to which it will be electrically connected.

Figure 3:
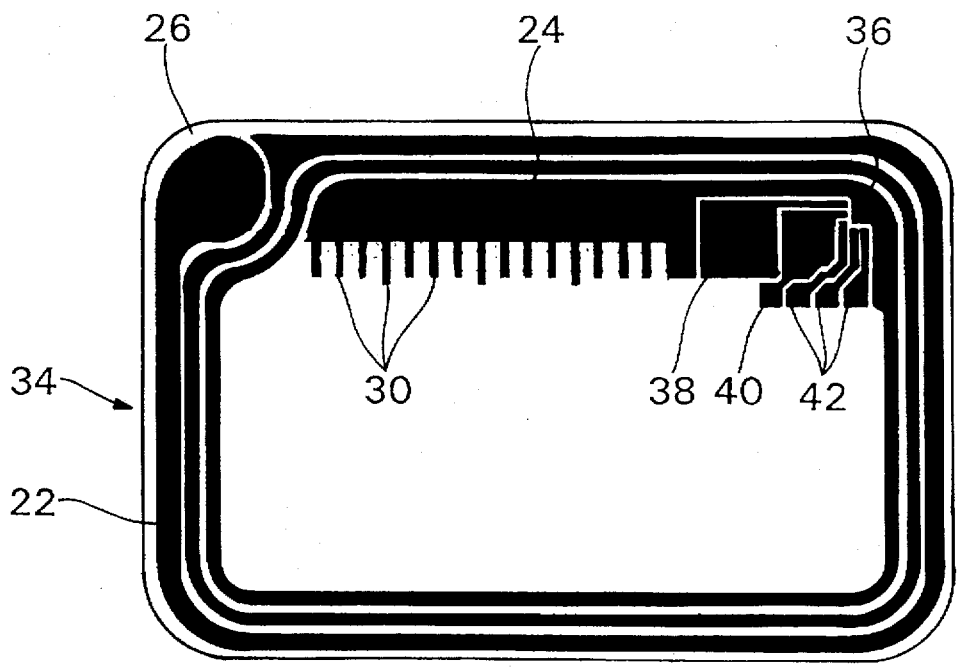
FIG. 3 is an enlarged plan view of one side of a flexible printed circuit RFID tag in accordance with a second embodiment of the present invention.
Figure 4:
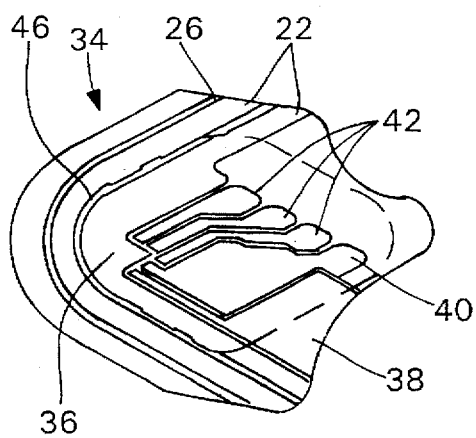
FIG. 4 is an enlarged plan view of a portion of the flexible printed circuit RFID tag of FIG. 3.
Figure 5:
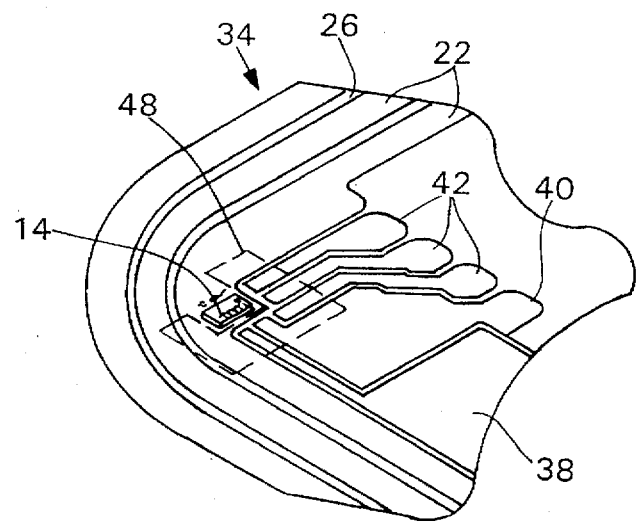
FIG. 5 is a greatly enlarged plan view of a portion of the flexible printed circuit RFID tag of FIG. 3, including an integrated circuit mounted thereto.

Referring now to FIG. 3, one side of a second preferred embodiment of an RFID tag 34 is shown. Like the tag 20, the tag 34 comprises a substrate 26, an inductive coil 22 which functions as an antenna, and a capacitor 24 having fingers or extensions 30 to permit adjusting the value of the capacitor 24. Preferably the substrate 26 comprises polyethylene which is formed in sheets and the inductive coil 22 and the capacitor 24 comprise etched aluminum foil, as previously described. The tag 34 also includes an IC attachment area 36 which comprises a filled in corner or shoulder of the inductive coil 22. In contrast to the isolated or floating IC attachment area 32 (FIG. 2), forming the IC attachment area 36 as an integral portion of the conductive pattern on one side of the substrate 26 surface provides a more stable support surface for the IC 14 because movement of the substrate 26 is absorbed over a greater area (e.g., vibration of the IC attachment area 36 caused by ultrasonic energy during wire bonding is absorbed not only by the IC attachment area 36, but also by the coil 22). Providing a more stable or stiff support area for the IC 14 is important in being able to properly wire bond the IC 14 to the resonant circuit 12, as described hereinafter.

Referring now to FIGS. 2 and 3, a plurality of bonding pads are also formed on the first side of the substrate 26 to which the IC 14 is electrically connected. A first bonding pad 38 is provided for connecting to the ANT input of the IC 14. A second bonding pad 40 is provided for connecting to the MOD output of the IC 14, and a plurality of bonding pads 42 are provided for connecting to the additional inputs 16 of the IC 14 used for programming the IC 14, as previously described. Each of the bonding pads 38, 40, 42 are formed of a conductive material and preferably are constructed of the same material as the first conductive pattern and are formed on the substrate 26 at the same time that the resonant circuit is formed on the substrate 26. The GND output of the IC 14 is connected to the coil 22 at a location on the coil 22 proximate to the IC Referring now to FIGS. 4-6 and 7, according to the present invention, the IC 14 is wire bonded to the bonding pads 38, 40, 42 and to the coil 22 with wires 44 (FIG. 6) using an ultra sonic welding process. In the preferred ultra sonic welding process, a wire bonder with a vacuum plenum table is used to interconnect an input/output pad on the IC 14 to a corresponding bonding pad 38/40/42 on the substrate 26 using a conductive wire, such as a 0.00125 inch aluminum wire.

Figure 7:
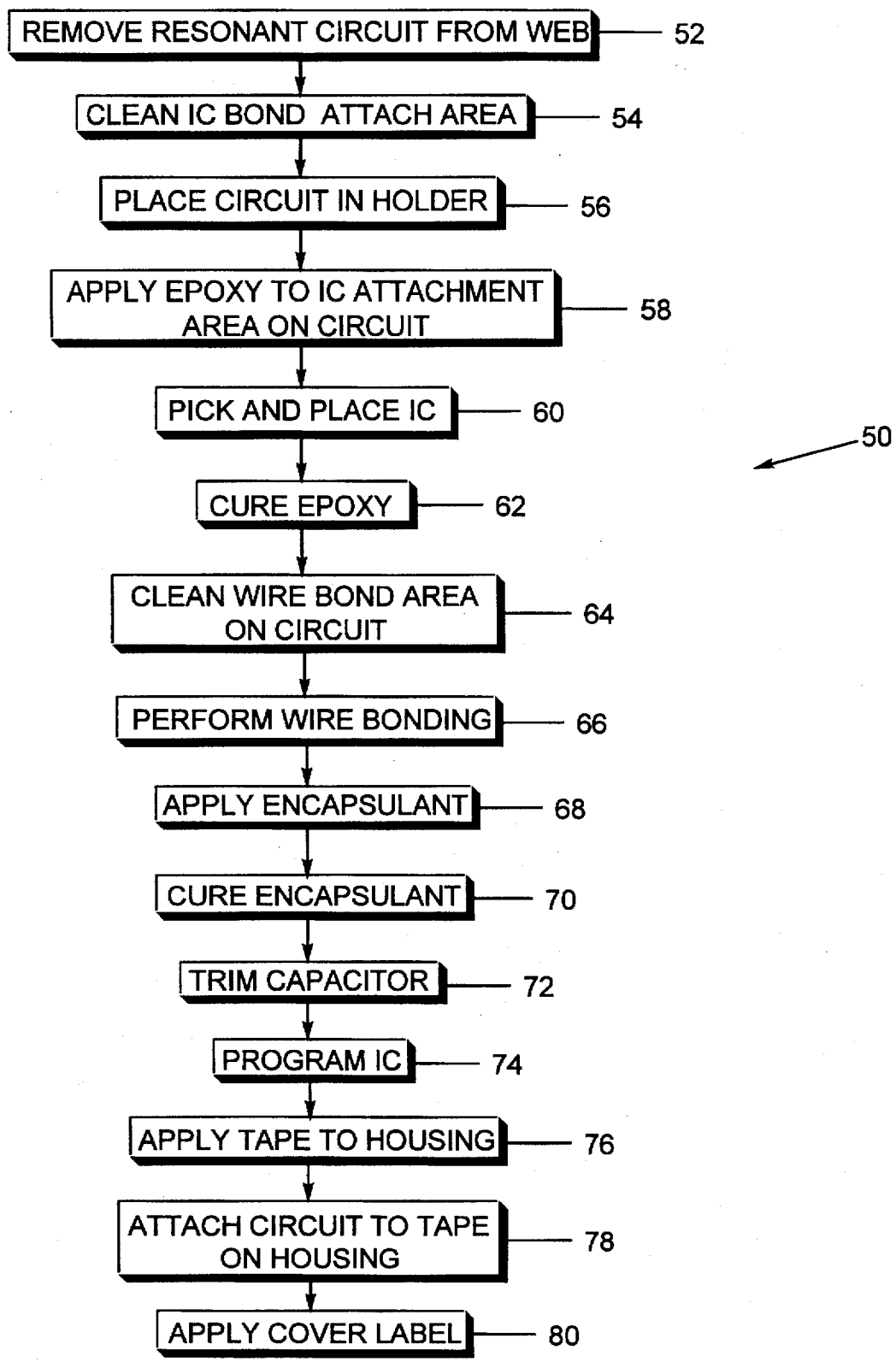
FIG. 7 is a flow chart of a process of constructing a resonant frequency identification tag in accordance with a preferred embodiment of the present invention.

FIG. 7 is a flow chart of the wire bonding process 50. In order to overcome the difficulties of wire bonding the IC 14 on the flexible substrate 26, it has been determined that proper cleaning of the bonding pads 38, 40 42, adhesively affixing the IC 14 to the IC attachment area 32/36, and securely holding the substrate 26 in a fixed position during the welding or wire bonding process are each important steps in ensuring a proper wire bond connection is made between the IC 14 and the bonding pads 38, 40, 42.

Beginning with step 52, the resonant circuit 12 is die cut from a web formed as part of the manufacturing process having a plurality of individual resonant circuits 12 formed thereon. Before the IC 14 is attached to the IC attachment area 36, an area of the substrate 26 and the resonant circuit 12 proximate to and including the IC attachment area 36, referred to generally as the IC bond attach area 46 (FIG. 4), is chemically cleaned at step 54 to remove any photoresist material which remains on the IC bond attach area 46 after the formation of the resonant circuit 12. In the preferred embodiment, the IC bond attach area 46 is cleaned with acetone using a cotton swab.

In step 56, the resonant circuit 12 is placed in a plenum or workholder designed to receive and securely hold the resonant circuit 12. Preferably the plenum includes a recess which is sized and shaped to receive the resonant circuit 12. Although plenums are known and commercially available which hold a workpiece within the plenum by vacuum pressure, it has been found that merely using vacuum pressure to hold the resonant circuit 12 within the plenum is not sufficient for maintaining the flexible substrate 26 therein and performing a wirebonding operation thereon. Accordingly, in the preferred manufacturing process, the resonant circuit 12 is held within the recess of the plenum both by vacuum pressure and by placing an adhesive means in the plenum circuit receiving area. The combination of vacuum pressure and adhesive has been found to adequately securely hold the resonant circuit 12 within the plenum so that an ultrasonic welding or wirebonding operation can be conducted. In the presently preferred embodiment, the adhesive means for attaching the resonant circuit 12 to the plenum is strong enough to hold the resonant circuit 12 is place on the plenum, yet allows the resonant circuit 12 to also be removed from the plenum without tearing or damaging the resonant circuit 12.

In step 58, an adhesive, preferably an epoxy, is applied to the IC attachment area 32/36 in order to secure or attach the IC to the IC attachment area 32/36. The IC 14 is attached to the IC attachment area 32/36 with such an adhesive in order to maintain the IC 14 in position and to ensure that the IC 14 does not move during the wire bonding operation. According to the present invention, it is preferred that more than a small dot of epoxy is placed on the IC attachment area 32/36 and that instead, a large pool of epoxy is used to make or form a stiffer and more stable base for the IC 14. That is, the epoxy should spread at least one to two mils beyond a perimeter of the IC 14 after the IC 14 has been placed thereon. Preferably, the IC 14 is attached to the IC attachment area 32/36 with an ultraviolet (UV) curable adhesive, such as a UV curable epoxy.

In step 60, the IC 14 is placed in the center of the IC attachment area 32/26. A vacuum-assist pickup tool may be used to pick up and place the IC 14 on the IC attachment area 32/26. Care is taken to assure that the IC 14 is properly oriented and seated squarely and that there is a sufficient fillet of epoxy around the IC 14. Coated tweezers or wooden paddles may be used to aid in the alignment of the IC 14. Care also is taken to avoid scratching or getting epoxy on a top side of the IC 14 or the bonding pads 38, 40, 42. After the IC 14 has been attached to the IC attachment area 32/36 with epoxy, in step 62, the epoxy is cured by placing the resonant circuit 12 through a UV cure conveyor oven. The UV cure conveyor oven uses ultraviolet light to cure the epoxy at a temperature of approximately 60° C. It is preferred to cure the epoxy at 60° C., since higher temperatures could destroy or damage the substrate 26 and the flexible circuit 12.

In step 64, those areas of the bonding pads 38, 40, 42 to which the wires 44 will be bonded, denoted as wire bond area 48 (FIG. 5), are cleaned to remove oxidation (e.g., $AlO_2$) and also to provide texture to the wire bond area 48 of the conductive material. Adding texture to the wire bond area 48 acts as an energy director and provides extra conductive material which is conducive to welding the wires 44 to the bonding pads 38, 40, 42. Accordingly, the cleaning step 64 is done with a mild abrasive, such as a synthetic steel wool scrubbing pad or a pencil eraser. It is also preferred that the cleaning step 64 be performed just prior to the wire bonding step in order to ensure that there is minimal or no oxidation on the conductive material during the wire bonding step.

Figure 6:
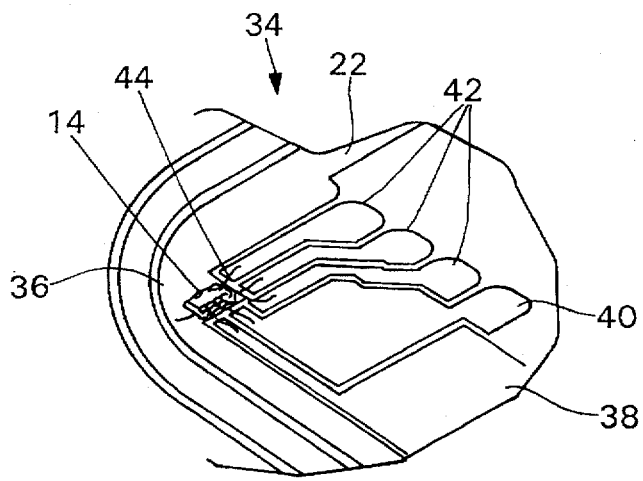
FIG. 6 is an enlarged plan view of a portion of the flexible printed circuit RFID tag of FIG. 3, including an integrated circuit mounted and wire-bonded thereto.

In step 66, the wires 44 are bonded to the IC 14 and the bonding pads 38, 40, 42 (FIG. 6). Preferably, the wire 44 is a 0.00125 inch aluminum wire having a break strength of 18–20 gm. The wire 44 is bonded to the bonding pads 38, 40, 42 and the IC 14 using a bonding apparatus and an ultrasonic generator of a type which is presently commercially available. Preferably, the bond strength is greater than 6 gm and the wire loop height does not exceed 0.015 inches. As previously discussed, since the resonant circuit 12 is constructed using a flexible substrate 26, it is important that the resonant circuit 12 be held firmly during the wire bonding process. Thus, also as previously discussed, it is presently preferred that the resonant circuit 12 be both adhesively held in the plenum and held by vacuum pressure to ensure that the ultrasonic energy generated by the wire bonding apparatus and directed to the IC 14 and the bonding pads 38, 40, 42 is not lost by movement or vibration of the IC 14 and/or the substrate 26. The wire bonding apparatus uses sonic vibration to partially melt portions of the wire 44 and bond the wire 44 to the bonding pads, 38, 40, 42, respectively. The combination of adhesively securing the resonant circuit 12 to the wire bonding machine, using vacuum pressure to secure the resonant circuit 12 to the wire bonding machine, and attaching the IC 14 to the resonant circuit 12 using epoxy adequately holds the resonant circuit 12 and the IC 14 such that effective wire bonds are formed.

After the IC 14 has been wire bonded to the resonant circuit 12, a protective covering or encapsulant 45 (FIG. 9) is placed at least over the wire bonds in step 68. Preferably, the encapsulant 45 covers the entire IC 14, the wires 44 and the wire bonds. The encapsulant 45 is applied using an encapsulant pneumatic dispenser, as is known to those of ordinary skill in the art. It is presently preferred that the encapsulant 45 is a light curing resin and that the finished height of the encapsulant 45 over the wire bonded IC 14 does not exceed 0.025 inches and that the diameter of the encapsulant 45 does not exceed 0.25 inches in order for the encapsulated IC 14 to fit within a recess of a polymeric housing, as hereinafter described.

In step 70, the encapsulant 45 is cured by placing the circuit 12 in a UV cure conveyor oven. Preferably, the encapsulant 45 is cured using ultraviolet light at a temperature of approximately 60° C. The encapsulant 45 is not cured by baking because the preferred polyethylene substrate 26 melts at approximately 75°0 C. Accordingly, baking would damage or destroy the substrate 26.

At step 72, the frequency of the resonant circuit 12 is measured by using a spectrum analyzer or a test setup using a frequency generator and a display monitor. The capacitor 24 is trimmed by cutting and removing one or more of the capacitor fingers 30, if necessary, in order to ensure that the resonant circuit 12 operates at a predetermined resonant frequency, which in the preferred embodiment is between 13.6 MHz to 13.8 MHz. In step 74, the IC 14 is programmed to store the desired data in the IC 14 in a manner well known in the art, preferably, by attaching probe leads from a computer to the programming pads 42.

Figure 8:
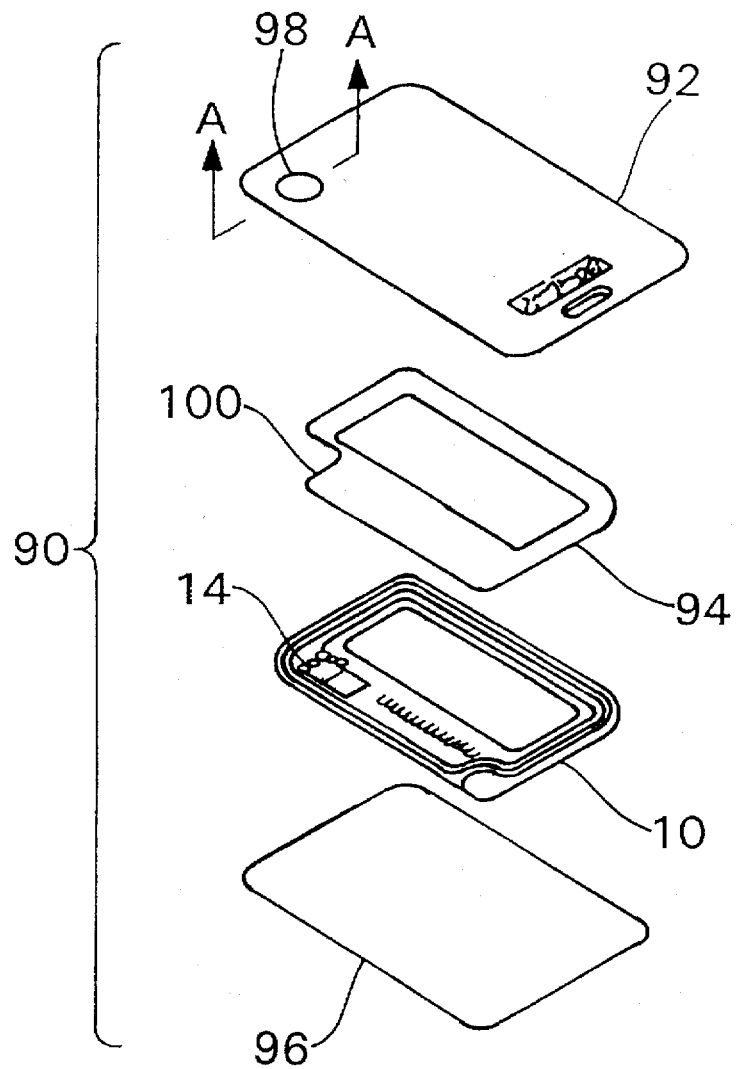
FIG. 8 is an exploded view of a resonant frequency identification tag in accordance with a preferred embodiment of the present invention.
Figure 9:
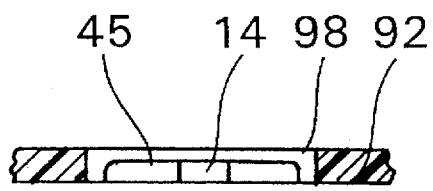
FIG. 9 is a sectional side view of a portion of a housing of the resonant frequency identification tag of FIG. 8.

Now that formation of the tag 10 including the resonant circuit 12 and the IC 14 has been completed, the tag 10 may be used for a variety of purposes and in a variety of different environments. One such use of the tag 10 is in a proximity card of the type used for access control. Referring now to FIG. 8, an exploded view of a proximity card 90 is shown. The proximity card 90 comprises the RFID tag 10, a housing 92, a double-sided transfer adhesive tape 94, and a cover label or backing 96. As shown in FIG. 9, the housing 92 includes a recess 98 located and sized for receiving the encapsulated IC 14 of the tag 10. The transfer adhesive tape 94 also includes a cutout area 100 in a corner thereof corresponding to the recess 98 and the IC 14 so that the IC 14 can be received within the recess 98.

In step 76 (FIG. 7), the double-sided transfer adhesive tape 94 is applied to the undersurface of the housing 92 in an orientation such that the cutout area 100 corresponds with the recess 98. In step 78, the tag 10 is attached to the transfer adhesive tape 94 on the housing 92 and the IC 14 is received within the recess 98 of the housing 92. Finally, in step 80, the cover label 96 is applied to the tag 10 with an adhesive (not shown). The cover label 96 may include printed indicia on its outer surface for advertising or identification purposes. The proximity card 90 is preferably formed in a rectangular shape to resemble a credit card in both size and shape, which is convenient for human handling. A sequence number and a date code for the card 90 may be stamped on an outer surface of the housing 92 or on the cover label 96. The housing 92 is preferably constructed of a polymeric material, such as polyvinylchloride and formed by injection molding or in some other manner, as is known in the art. The transfer adhesive tape 94 is preferably a double-sided, double-lined two mil adhesive tape, which is generally commercially available in packaged rolls. The proximity card 90 may be used as an access control card as is known by those of skill in the art. Alternatively, the tag 10 could be used as a security label which is placed on a retail item for use in security or product warranty purposes. It will also be apparent to those of skill in the art that the tag 10 can be used in other commercial applications.

From the foregoing description, it can be seen that the present embodiment comprises a method of wire bonding an IC to a flexible substrate composed of a material which cannot withstand high temperatures required for soldering processes. It will be recognized by those skilled in the art that changes may be made to the above-described embodiment of the invention without departing from the inventive concepts thereof. It is understood, therefore, that this invention is not limited to the particular embodiment disclosed, but is intended to cover any modifications which are within the scope and spirit of the invention as defined by the appended claims.

We claim:

1. A method of electrically connecting an integrated circuit (IC) to at least one electrical conductor on a flexible substrate comprising the steps of:

(a) providing a flexible dielectric substrate having an IC attachment area located on one of a first principal surface and a second, opposite principal surface of the substrate and at least one resonant circuit comprising a first conductive pattern disposed on the first principal surface and a second conductive pattern disposed on the second principal surface, wherein the first conductive pattern is electrically connected to the second conductive pattern such that the first and second conductive patterns form an inductor and a capacitor, wherein the inductor functions as an antenna;

(b) cleaning an IC bond attach area of the substrate, the IC bond attach area comprising an area of the substrate and the resonant circuit proximate to and including the IC attachment area;

(c) securing the flexible substrate in a fixed position to prevent substantial movement of the substrate;

(d) securing the IC to the IC attachment area of the flexible substrate to minimize movement of the IC relative to the flexible substrate;

(e) wire bonding the IC to the resonant circuit, thereby electrically connecting the IC to the resonant circuit with at least one wire bond; and (f) applying a protective covering over the at least one wire bond to protect the at least one wire bond from being damaged by external forces.

2. The method of claim 1 wherein the flexible substrate comprises a polyethylene layer.

3. The method of claim 2 wherein the conductive patterns comprise aluminum.

4. The method of claim 1 wherein the IC is secured to the flexible substrate in step (d) with an epoxy and wherein the epoxy spreads beyond a perimeter of the IC, thereby forming a stiff region on the substrate proximate the IC.

5. The method of claim 4 further comprising the step of curing the epoxy prior to wire bonding the IC to the substrate in step (e).

6. The method of claim 5 wherein the epoxy is cured with ultraviolet light.

7. The method of claim 1 wherein the IC bond attach area is cleaned in step (b) with acetone.

8. The method of claim 7 further comprising the step of abrasively cleaning at least a portion of the resonant circuit proximate to the IC attachment area to remove oxidation therefrom prior to performing the wire bonding step (e).

9. The method of claim 1 wherein the protective covering comprises an encapsulant.

10. The method of claim 9 further comprising after step (f), the step of curing the encapsulant with ultraviolet light.

11. The method of claim 1 further comprising the step of positioning the IC in a predetermined orientation with respect to the flexible substrate.

12. The method of claim 1 wherein the IC is wire bonded to the resonant circuit by ultrasonic welding, wherein securing the IC to the IC attachment area and securely holding the substrate in a fixed position prevents substantial movement of both the substrate and the IC, thereby preventing excessive energy dissipation during the welding process.

13. The method of claim 1 wherein the substrate is securely held in the fixed position in step (c) in a plenum utilizing vacuum pressure and an adhesive.

14. The method of claim 1 further comprising after step (f), the step of adhesively attaching the flexible substrate to a polymeric housing having a recess for accommodating the IC.

15. The method of claim 1 further comprising after step (f), the step of programming the IC with predetermined digitally encoded information.

16. The method of claim 1 wherein the IC attachment area comprises a portion of one of the first and second conductive patterns wherein the one conductive pattern provides a stiff region to which the IC is secured.

17. A radio frequency identification (RFID) tag for use with a communication system having means for detecting the presence of an RFID tag within a surveilled area utilizing electromagnetic energy at a frequency within a predetermined frequency range and means for receiving digitally encoded information transmitted from the RFID tag, the RFID tag comprising:

a flexible dielectric substrate;

at least one resonant circuit comprising a first conductive pattern disposed on a first principal surface of the flexible substrate and a second conductive pattern disposed on a second, opposite principle surface of the flexible substrate, wherein the first conductive pattern is electrically connected to the second conductive pattern such that the first and second conductive patterns form an inductor and a capacitor, wherein the inductor functions as an antenna;

an IC attachment area on one of the first and second principal surfaces of the substrate;

an integrated circuit (IC) attached to the IC attachment area and electrically connected to the resonant circuit, the IC storing digitally encoded information, wherein detection by the antenna of a signal at a predetermined frequency causes the antenna to provide power to the IC such that the digitally encoded information is output therefrom and transmitted by the antenna at a predetermined frequency range; and an encapsulant covering the IC and the electrical connections between the IC and the resonant circuit.

18. The security tag of claim 17 wherein the IC attachment area comprises a shoulder of the inductor formed by one of the first and second conductive patterns.

19. The security tag of claim 17 wherein the IC is adhesively attached to the IC attachment area.

20. The security tag of claim 17 wherein the first and second conductive patterns comprise etched aluminum.

21. The security tag of claim 17 further comprising a polymeric housing covering the first conductive pattern and the IC, wherein the housing includes a recess for receiving the IC therein.

* * * * *